US 6,743,389 B2

(12) United States Patent
Miyajima et al.

(10) Patent No.: US 6,743,389 B2
(45) Date of Patent: Jun. 1, 2004

(54) RESIN MOLDING MACHINE AND METHOD OF RESIN MOLDING

(75) Inventors: Fumio Miyajima, Nagano (JP); Kunihiro Aoki, Nagano (JP); Tsutomu Miyagawa, Nagano (JP); Hideaki Nakazawa, Nagano (JP)

(73) Assignee: Apic Yamada Corporation, Nagano (JP)

( * ) Notice: Subject to any disclaimer, the term of this patent is extended or adjusted under 35 U.S.C. 154(b) by 299 days.

(21) Appl. No.: 09/970,687

(22) Filed: Oct. 5, 2001

(65) Prior Publication Data

US 2002/0015748 A1 Feb. 7, 2002

(51) Int. Cl.[7] ............................................. B29C 70/78
(52) U.S. Cl. .................... 264/272.17; 264/316; 425/89; 425/125; 425/127
(58) Field of Search ........................ 425/89, 121, 123, 425/125, 127; 264/272.14, 272.17, 316; 438/112

(56) References Cited

U.S. PATENT DOCUMENTS

| 6,117,382 | A | * | 9/2000 | Thummel | 264/272.14 |
| 6,173,490 | B1 | * | 1/2001 | Lee et al. | 264/272.14 |
| 6,344,162 | B1 | * | 2/2002 | Miyajima | 264/272.14 |
| 6,478,562 | B1 | * | 11/2002 | Miyajima | 425/89 |
| 6,511,620 | B1 | * | 1/2003 | Kawahara et al. | 425/121 |
| 6,544,816 | B1 | * | 4/2003 | Lim et al. | 438/112 |

FOREIGN PATENT DOCUMENTS

| EP | 759349 | A2 | * | 2/1997 | B29C/33/68 |
| EP | 933808 | A2 | * | 8/1999 | H01L/21/56 |
| JP | 05-315512 | | | 11/1993 | |
| JP | 05-343458 | | | 12/1993 | |
| JP | 11-077734 | | | 3/1999 | |
| JP | 2000277551 | A | * | 10/2000 | H01L/21/56 |
| JP | 2000299334 | A | * | 10/2000 | H01L/21/56 |
| JP | 2000299335 | A | * | 10/2000 | H01L/21/56 |
| JP | 2001160564 | A | * | 6/2001 | H01L/21/56 |
| JP | 2001176902 | A | * | 6/2001 | H01L/21/56 |

* cited by examiner

*Primary Examiner*—Robert B. Davis
(74) *Attorney, Agent, or Firm*—Birch, Stewart, Kolasch & Birch, LLP (57) ABSTRACT

The resin molding machine and a method of resin molding of the present invention are capable of securely and efficiently mold a work piece, on which a plurality of elements are arranged. The resin molding machine comprises: a lower die on which a work piece to be molded is set; an upper die clamping the work piece with the lower die; a clamper being provided to the upper die, the clamper enclosing a resin molding space of the upper die, the clamper being capable of vertically moving in the upper die and always biased downward, wherein a lower end of the clamper is downwardly projected from a resin molding face of the upper die when the lower die and upper die are opened; and a release film feeding mechanism feeding release film, which is easily peelable from the upper die and resin for molding, so as to cover the rein molding space.

8 Claims, 6 Drawing Sheets

RESIN MOLDING MACHINE AND METHOD OF RESIN MOLDING

BACKGROUND OF THE INVENTION

The present invention relates to a resin molding machine and a method of resin molding, more precisely relates to a resin molding machine for molding a work piece on which a plurality of elements, e.g., semiconductor chips, and a method of molding the same with resin.

Figure 13:
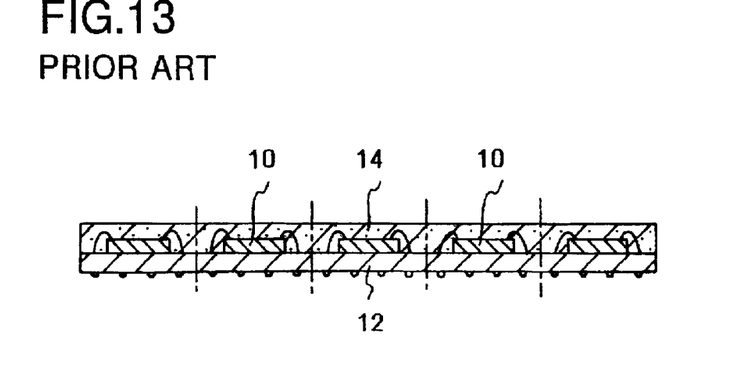
FIG. 13 is the sectional view of the product molded by the conventional method.

A conventional method of manufacturing semiconductor devices molded with resin will be explained with reference to FIG. 13. A work piece 12 is a substrate on which a plurality of semiconductor chips 10 are matrically arranged with prescribed separations. An upper side of the substrate 12, on which the semiconductor chips 10 have been mounted, is molded with resin 14. Each semiconductor chip 10 is cut together with a basic material of the substrate 12 and the solidified resin 14, so that a plurality of semiconductor devices can be produced. By the method, many semiconductor chips 10 can be provided on the substrate 12 with high density and molded with the resin 14, so that small semiconductor devices can be efficiently manufactured.

However, in the conventional method, the substrate 12 is molded by potting the resin 14, so it takes a long time to solidify the resin 14. In the case of molding in a molding die, if thickness of the substrate 12 is not even, resin flash is formed, wires are badly moved in the resin and forming voids cannot be prevented.

SUMMARY OF THE INVENTION

The present invention was invented to solve the problems of the conventional method.

An object of the present invention is to provide a resin molding machine and a method of resin molding, in each of which a work piece, e.g., a semiconductor wafer, on which a plurality of elements, e.g., semiconductor chips, are arranged, can be securely and efficiently molded.

To achieve the object, the resin molding machine of the present invention comprises:
 a lower die on which a work piece to be molded is set;
 an upper die clamping the work piece with the lower die;
 a clamper being provided to the upper die, the clamper enclosing a resin molding space of the upper die, the clamper being capable of vertically moving in the upper die and always biased downward, wherein a lower end of the clamper is downwardly projected from a resin molding face of the upper die when the lower die and upper die are opened; and
 a release film feeding mechanism feeding release film, which is easily peelable from the upper die and resin for molding, so as to cover the resin molding space. Since the work piece is molded with the release film, no resin is stuck on the resin molding face of the die and a molded product can be easily peeled off from the die. The resin molding space is securely sealed by the release film, so the work piece can be securely molded without forming resin flash. Since the work piece is set in the lower die, the work piece can be easily set and preheated.

The resin molding machine may further comprise another release film feeding mechanism feeding release film so as to cover a surface of the lower die on which the work piece is set.

The resin molding machine may further comprise a release film sucking mechanism, which fixes the release film on a lower end face of the clamper by air suction and which fixes the release film on an inner face of the resin molding space, which is constituted by the resin molding face of the upper die and an inner face of the clamper, by sucking air from an ceiling face of the resin molding space.

The release film sucking mechanism may comprise:
 a first air-hole being opened in the lower end face of the clamper;
 a second air-hole being opened in an inner face of the clamper and communicated to an air path, which communicates the second air-hole to a side face of the upper die; and
 an air sucking unit being communicated to the first air-hole and second air-hole for air suction.

In the resin molding machine, the upper die may have a plurality of cavities, which respectively correspond to element portions of the work piece. With this structure, the work piece, on which a plurality of elements, e.g., semiconductor chips, are arranged, can be easily molded.

In the resin molding machine, the lower die may have a plurality of cavities, which respectively correspond to the element portions of the work piece.

In the resin molding machine, the upper die may be capable of moving in the vertical direction and biased toward the lower die.

In the resin molding machine, the lower die further may have an overflow cavity for reservoiring resin overflowed from the resin molding space when the work piece is molded with the resin; and
 the clamper may have a resin path communicating the resin molding space to the overflow cavity.

The method of the present invention comprises the steps of:
 setting a work piece to be molded on a lower die;
 feeding release film, which is easily peelable from the upper die and resin for molding, between an upper die and the work piece so as to cover a resin molding space of the upper die;
 clamping the work piece and the release film by the upper die and the lower die; and
 molding the work piece with the resin,
 wherein a clamper, which is provided to the upper die, which encloses the resin molding space and which is capable of vertically moving and biased downward so as to downwardly projected a lower end of the clamper from a resin molding face of the upper die, contacts the work piece molded so as to seal peripheral of the resin molding space in the clamping step, and
 wherein the resin is introduced into the resin molding space while the upper die is gradually moved to the lower die, the movement of the upper die is stopped at a clamping position, then the resin molding space is fully filled with the resin so as to completely mold the work piece.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

Figure 1:
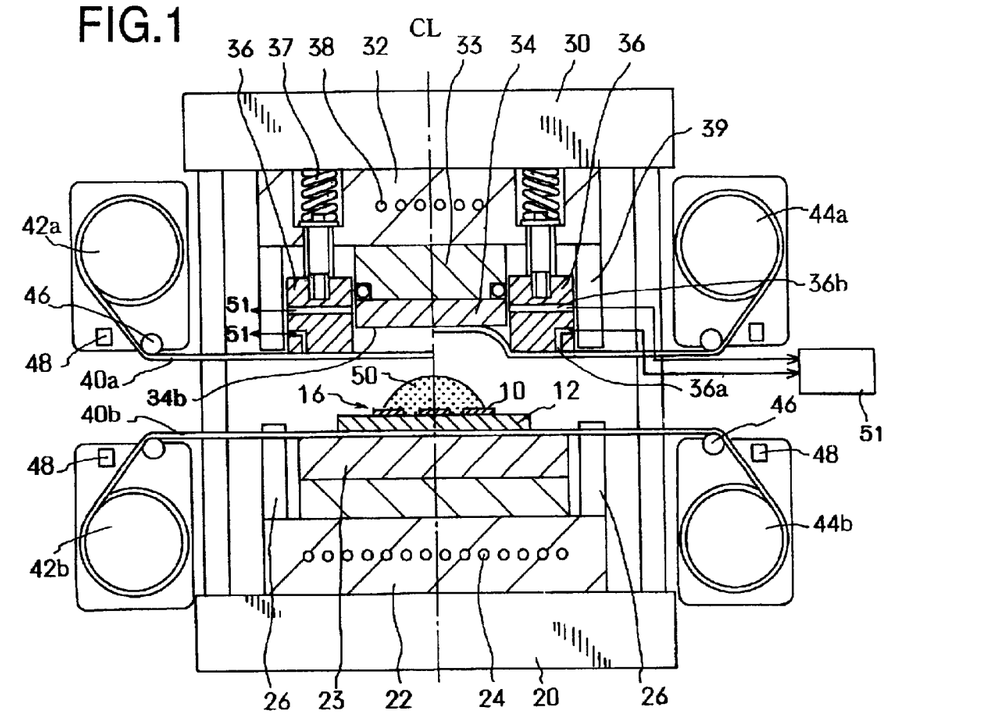
FIG. 1 is an explanation view of a resin molding machine of a first embodiment of the present invention.

FIG. 1 shows a main part of a resin molding machine of a first embodiment. A fixed platen 20 and a movable platen 30 are connected to a press unit, in which a work piece 16 is molded. The press unit is driven by electric means or hydraulic means. The movable platen 30 is vertically moved by the press unit for resin molding.

A lower base 22 is fixed to the fixed platen 20. A lower die 23 is fixed to the lower base 22. A setting section is formed in an upper face of the lower die 23. The work piece 16 to be molded includes a substrate 12 and a plurality of semiconductor chips 10, which are matrically arranged on the substrate 12. The work piece 16 is set in the lower die 23, and the semiconductor chips 10 are provided on an upper face of the substrate 12.

Heaters 24 are provided in the lower base 23. The heaters 24 heat the lower base 23 and the work piece 16 set in the lower base 23. Lower clamper stoppers 26 define a clamping position of an upper die 34 and the lower die 23. The lower clamper stoppers 26 are upwardly extended from the lower base 22.

An upper base 32 is fixed to the movable platen 30. An upper holder 32 is fixed to the upper base 32. The upper die 33 is fixed to the upper holder 33. In the resin molding machine of the present embodiment, the semiconductor chips 10 are provided on one side face (the upper side face) of the substrate 12, and the whole upper side face of the substrate 12 is molded and made flat with resin. A clamper 36 is formed into a frame-shape and encloses side faces of the upper die 34 and the upper holder 33. The clamper 36 is attached to the upper base 32 and capable of vertically moving with respect thereto. The clamper 36 is always biased toward the lower die 23 by springs 37. A resin molding face 34b of the upper die 34 is located slightly above a lower end face of the clamper 36. A resin molding space is formed by an inner face of the clamper 36 and the resin molding face 34b of the upper die 34. Note that, the clamper 36 may be biased by proper means, e.g., an air cylinder, other than the springs 37.

Heaters 38 are provided in the upper base 32. The heaters 38 heat the upper holder 33 and the upper die 34, so that the work piece 16 can be heated when the dies 23 and 34 are closed.

Upper clamper stoppers 39 are downwardly extended from the upper base 32. Lower end faces of the upper clamper stopper 39 contact upper end faces of the lower clamper stopper 26 when the dies 23 and 34 are closed. When the movable platen 30 is moved downward by the press unit, the upper clamper stoppers 39 contact the lower clamper stopper 26 at the clamping position. Depth of the resin molding space is defined by the clamping position.

Release films 40a and 40b are formed like long belts. The release film 40a covers the resin molding face 34b of the upper die 34; the release film 40b covers a surface of the lower die 23. By using the release films 40a and 40b, no resin directly contacts inner faces of the resin molding space. The release films 40a and 40b are made of a film-shaped soft material, which can be easily peelable from the dies 23 and 34 and has enough heat-resistively, e.g., PTFE, ETFE, PET, FEP, glass cloth including fluorine, polypropylene, polyvinylidene chloride. Therefore, the release film 40a is capable of fitting along the inner faces of the resin molding space.

In the first embodiment, only the upper side of the substrate 12 is molded with resin, so the release film 40a for the upper die 34 contacts the resin. By feeding the elastic and compressible release film 40b to wholly cover the lower die 23, unevenness of the thickness of the substrate 12 can be effectively absorbed. Therefore, the work piece 16 can be molded without forming resin flash. Note that, the release film 40b for the lower die 23 may be omitted.

Film feeding rolls 42a and 42b respectively feed the release films 40a and 40b; film collecting rolls 44a and 44b respectively collect the used release films 40a and 40b. As shown in FIG. 1, the film feeding rolls 42a and 42b is located on one side of the resin molding machine; the film collecting rolls 44a and 44b is located on the other side thereof. The film feeding roll 42a and the film collecting roll 44a for the upper die 34 are attached to the movable platen 30; the film feeding roll 42b and the film collecting roll 44b for the lower die 23 are attached to the fixed platen 20. With this structure, the release films 40a and 40b are moved from the film feeding rolls 42a and 42b to the film collecting rolls 44a and 44b bia a space between the lower die 23 and the upper die 34. The film feeding roll 42a and the film collecting roll 44a for the upper die 34 are vertically moved together with the movable platen 30. Symbols 46 stand for guide rollers, and symbols 48 stand for ionizers, which remove static electricity charged in the release films 40a and 40b.

The release film 40a fed to the upper die 34 is fixed onto the upper die 34 and held by air suction. The clamper 36 has air-holes 36a, which are opened in the lower end face of the clamper 36, and air-holes 36b, which are opened in the inner side faces of the clamper 36. An air sucking unit 51, which is located outside of the dies 23 and 34, is communicated to the air-holes 36a and 36b. A seal ring (O-ring) is provided to the upper holder 33 so as to air-tightly seal a space between the upper holder 33 and the clamper 36. With this structure, no air is leaked when air is sucked through the air-holes 36b. An air path is formed by side faces of the upper die 34, side faces of the upper holder 33 and inner faces of the clamper 36, so that the release film 40a can be fitted and fixed onto the inner faces of the resin molding space, which is constituted by the upper die 34 and the clamper 36, by sucking the air through the air-holes 36b. Note that, if the air sucking unit 51 is capable of supplying compressed air to the air-holes 36a and 36b, the release film 40b can be easily peeled from the upper die 34.

Successively, a method of molding the work piece 16 by the resin molding machine will be explained.

In FIG. 1, the left side of a center line CL shows a state, in which the dies 23 and 34 are opened and the movable platen 30 is located at an uppermost position. In this state, the release films 40a and 40b are newly fed onto surfaces of the dies 23 and 34, then the work piece 16 is set in the lower die 23. The work piece 16 is set on the release film 40b covering the surface of the lower die 23.

In FIG. 1, the right side of the center line CL shows a state, in which the release film 40a is sucked and fixed on the upper die 34 and the lower end face of the clamper 36 by actuating the air sucking unit 51. The release film 40a is fed close to the surface of the surface 34b of the upper die 34, then the air is sucked through the air-holes 36a and 36b. By sucking the air, the release film 40a is fitted and fixed onto the lower end face of the clamper 36, then the release film 40a is fitted and fixed on the inner faces of the clamper 36 and the resin molding face 34b of the upper die 34. Since the release film 40a has enough softness and extensibility, the release film 40a can be sucked along the inner faces of the clamper 36 and the resin molding face 34b of the upper die 34. The air-holes 36a are arranged in the lower end face of the clamper 36, with regular separation, so as to enclose the upper die 34.

The release film 40a is fixed on the upper die 34 by air suction. On the other hand, resin 50 for molding the work piece 16 is supplied onto the substrate 12 of the work piece 16, which has been set in the lower die 23. Amount of the resin 50 corresponds to capacity of the resin molding space. In the first embodiment, the resin 50 is paste-type resin having enough fluidity and supplied by potting. Since the resin 50 has enough fluidity, the resin 50 is capable of easily moving in and effectively filling the resin molding space, which is formed as a closed cavity when the work piece 16 is clamped between the dies 23 and 34. In some cases, solid resin is used. But the solid resin must be easily melted so as not to badly influence the work piece when the work piece is clamped between the dies and the solid resin. Note that, thermosetting resin is used in many cases, but thermoplastic resin may be used.

Figure 2:
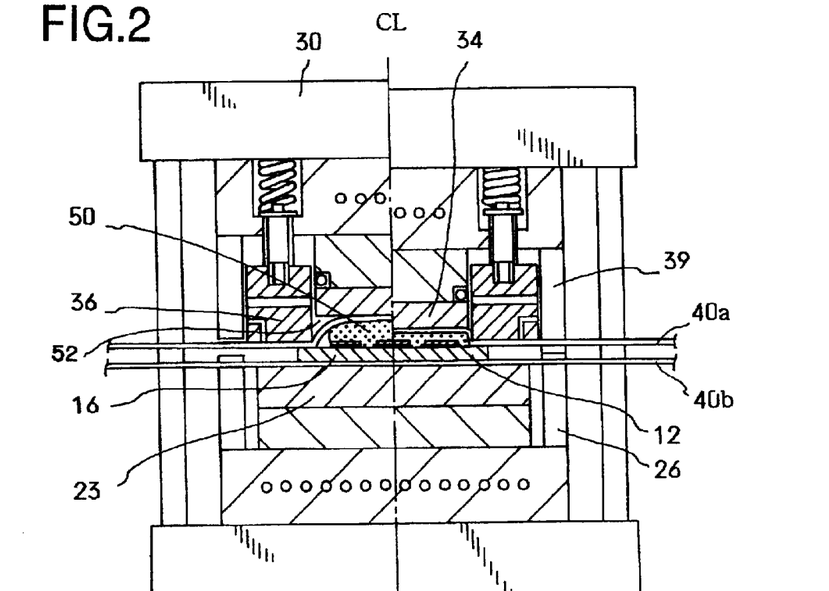
FIG. 2 is an explanation view of the resin molding machine of the first embodiment, in which a work piece is molded.

FIG. 2 shows a state of clamping the work piece 16 between the dies 23 and 34. A left side of a center line CL shows a state, in which the upper die 34 is moved downward and the lower end face of the clamper 36 presses the substrate 12 of the work piece 16. The upper die 34 does not reach the lowermost position. The resin molding space is closed by the clamper 36, and the resin 50 is pressed by the upper die 34. The resin 50 begins to fill the resin molding space.

In FIG. 2, a right side of the center line CL shows a state, in which the upper die 34 reaches the clamping position. At the clamping position, the lower ends of the upper clamper stoppers 39 contact the upper ends of the lower clamper stopper 26. Clamping force moves the clamper 36 upward against elasticity of the springs 37, so that the resin 50 in the resin molding space can have prescribed thickness.

By moving the upper die 34 until reaching the clamping position, the resin molding space has a prescribed depth, so that the resin 50 filling the resin molding space can have the prescribed thickness. As shown in FIG. 2, in the left side of the center line CL, a small gap 52 is formed, between the inner faces of the resin molding space and the release film 40a, at an upper corner of the resin molding space, but the gap 52 is disappeared when the upper die 34 reaches the clamping position, so that the resin molding space can be fully filled with the resin 50.

Since edges of the substrate 12 are securely sealed by the clamper 36 and the release film 40a, no resin is leaked from the resin molding space while molding the work piece 16. In the case that wire patterns are formed on the upper face of the substrate 12 like minute steps, the minute steps can be absorbed by the release film 40a, so that no resin leaks from the resin molding space when the dies 23 and 34 clamp the work piece 16. As described above, the lower release film 40b can absorb the unevenness of the thickness of the work piece 16, so that the work piece 16 can be properly molded.

After the resin 50 is heated and solidified in the closed dies 23 and 34, the dies 23 and 34 are opened to take out a molded product. Since the dies 24 and 34 are covered with the release films 40a and 40b, the resin 50 does not contact the molding dies 23 and 34. The release films 40a and 40b are easily peelable from the dies 23 and 34, so the molded product can be easily taken out therefrom. As described above, the release film 40a may be peeled from the upper die 34 by blowing compressed air from the air-holes 36a and 36b.

After the dies 23 and 34 are opened, the rolls 42a, 42b, 44a and 44b are driven so as to newly feed the release films 40a and 40b onto the surfaces of the dies 23 and 34. The release film 40a is easily peeled from the solidified resin 50 too.

Figure 3:
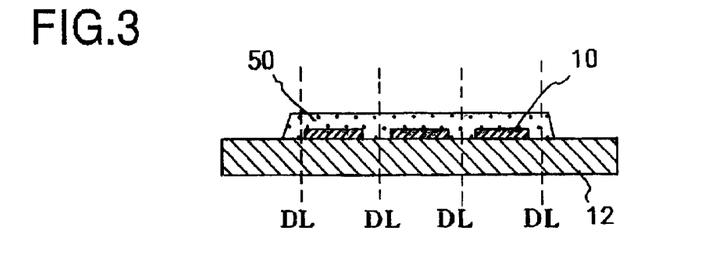
FIG. 3 is a sectional view of a product molded by the resin molding machine of the first embodiment.

FIG. 3 shows the product molded in the resin molding machine. The resin molding face 34b of the upper die 34 is flat, so an upper face of molded part is made flat. The molded product is divided along lines DL by proper means, e.g., a dicing saw, laser means, so as to make a plurality of semiconductor devices.

A second embodiment will be explained with reference to FIGS. 4 and 5. In the second embodiment, an overflow cavity 23a is formed in the lower die 23. The resin 50 overflows when the work piece 16 is molded.

Basic structures of the lower die 23, upper die 34, clamper 36, etc. are equal to that of the first embodiment, but a step section 36c is formed at an inner edge of the clamper 36, which contacts an edge of the substrate 12. With this structure, the resin 50 overflows from the resin molding space and is introduced into the overflow cavity 23a when the dies 23 and 34 clamp the work piece 16.

The overflow cavity 23a is formed in the surface of the lower die 23. The overflow cavity 23a is formed like a groove enclosing the substrate 12. In the second embodiment, one overflow cavity 23a is formed to enclose the substrate 12, but a plurality of overflow cavities may be formed in the lower die 23 as resin reservoirs.

To easily discharge surplus resin when the dies 23 and 34 clamp the work piece 16, a gate or gates 36d, which are communicated to the overflow cavity 23a, may be partially formed in an inner face of the step section 36c.

Figure 4:
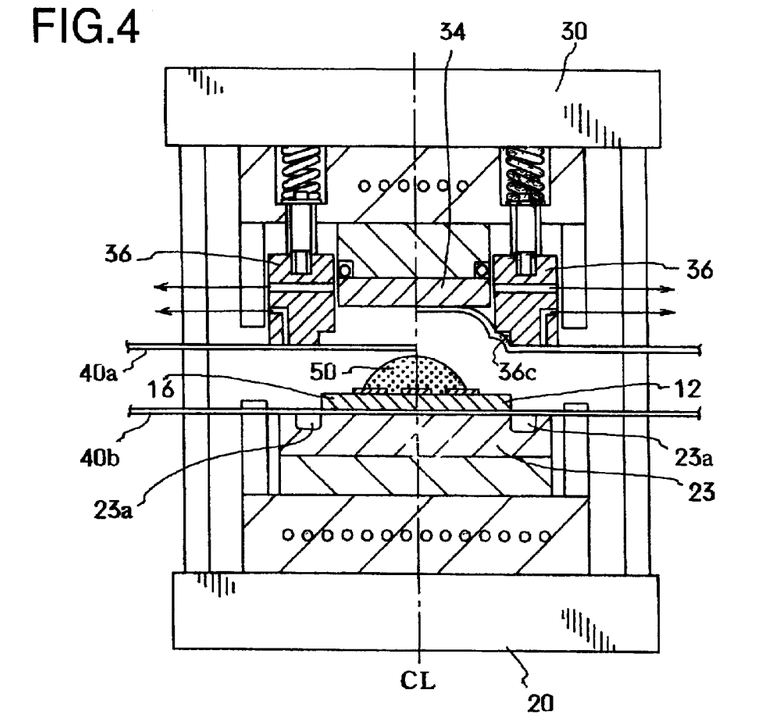
FIG. 4 is an explanation view of a resin molding machine of a second embodiment.

FIG. 4 shows a state, in which the dies 23 and 34 are opened, the work piece 16 is set in the lower die 23 and the release film 40a is fixed on the upper die 34 by air suction.

Figure 5:
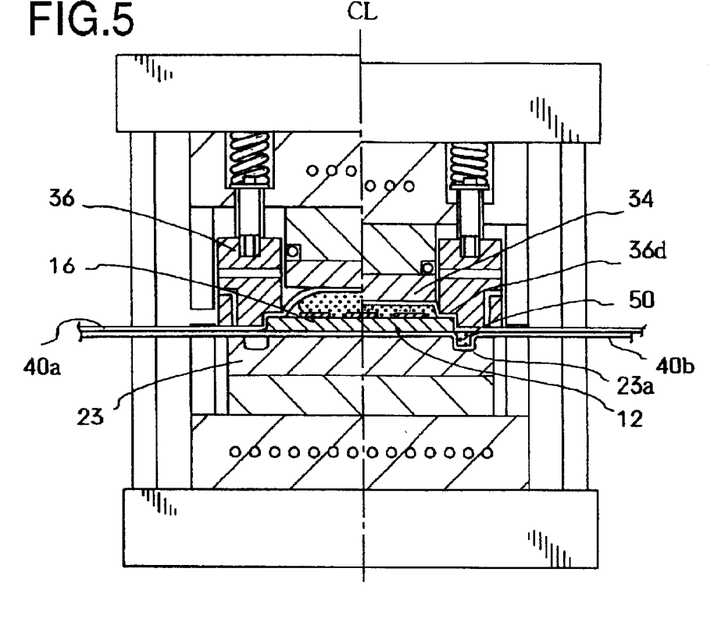
FIG. 5 is an explanation view of the resin molding machine of the second embodiment, in which a work piece is molded.

In FIG. 5, the dies 23 and 34 clamp the work piece 16. A left side of a center line CL shows a state, in which the clamper 36 presses the substrate 12 of the work piece 16 together with the release film 40a; a right side of the center line CL shows a state, in which the dies 23 and 34 are closed and the resin 50 overflows from the resin molding space to the overflow cavity 23a.

By overflowing the resin 50, shortage of the resin 50 for filling the resin molding space can be prevented. Namely, amount of supplying the resin 50 is slightly greater than capacity of the resin molding space, so that the surplus resin overflows to the overflow cavity 23a. If amount of supplying the resin 50 varies, the method of overflowing the resin is capable of effectively molding the work piece.

Figure 6:
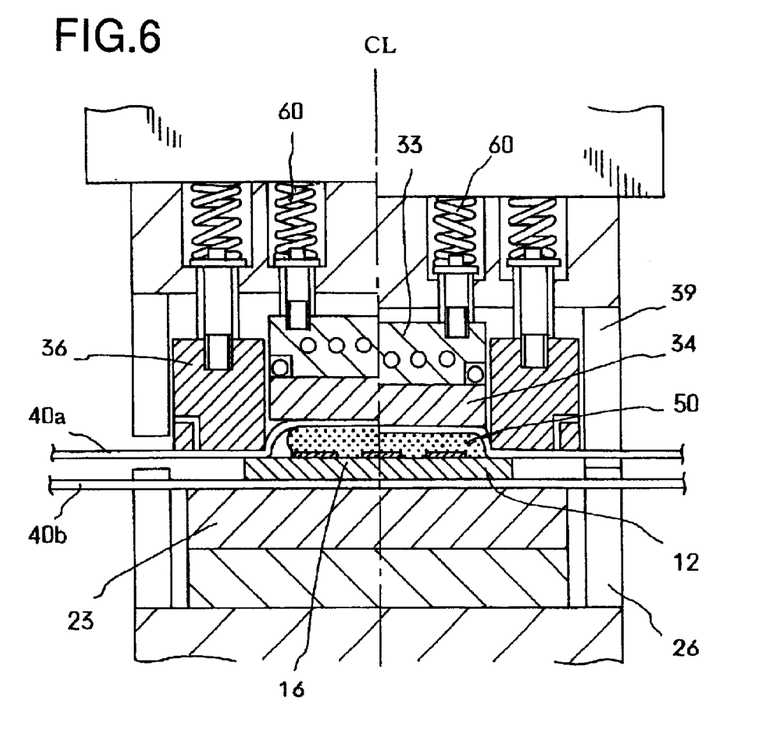
FIG. 6 is an explanation view of a resin molding machine of a third embodiment.

A third embodiment will be explained with reference to FIG. 6. In the present embodiment, the upper holder 33 and the upper die 34 are capable of moving in the vertical direction, and the upper die 34 is always biased toward the lower die 23 by springs 60. A left side of a center line CL shows a state of clamping the work piece 16 by the clamper 36; a right side of the center line CL shows a state of closing the dies 23 and 34 by the fixed platen 20 and the movable platen 30.

In the third embodiment, the upper die 34 is moved in the vertical direction, so the upper die 34 is moved against elasticity of the springs 60 by counter force of the resin 50, which works on the upper die 34 when the dies 23 and 34 are closed. Proper amount of the resin 50 is supplied on the work piece 16, which has been set in the lower die 23, but it is difficult to supply the same amount of the resin 50 every time. Even if the amount of the resin 50 is greater than predetermined amount, the upper die 34 is further moved upward to absorb surplus resin. Note that, in the present embodiment, the lowest position of the upper die 34, which is biased downward by the springs 60, is slightly lower than a desired level, which corresponds to desired thickness of the solidified resin 50 of the molded product. With this structure, surplus and shortage of the supplied resin 50 can be solved.

In the case of using liquid resin, amount of resin can be correctly measured, so the amount of the resin varied little. The variation of amount of the resin influences height of a molded part of the molded product. In the present embodiment, the molded part of the product is broad, so the variation of the height is small. Further, the movable die 34 can effectively absorb the variation of amount of the resin. If the substrate 12 is a plastic plate, thickness of the substrate 12 is not fixed every time, so variation of thickness of the substrates also can be absorbed by the movable die 34.

The elasticity of the springs 60 are designed to generate proper resin pressure when the dies 23 and 34 are closed to clamp the work piece 16. Note that, other biasing means capable of adjusting biasing force, e.g., a stepping motor, a servo motor, may be used instead of the springs 60. Since the upper die 34 is the movable die, the resin molding can be executed with vibrating the upper die 34. If proper vibration, e.g., 60–120 Hz, is applied to the upper die 34, the cavity of the resin molding space can be perfectly filled with the resin 50.

Figure 7:
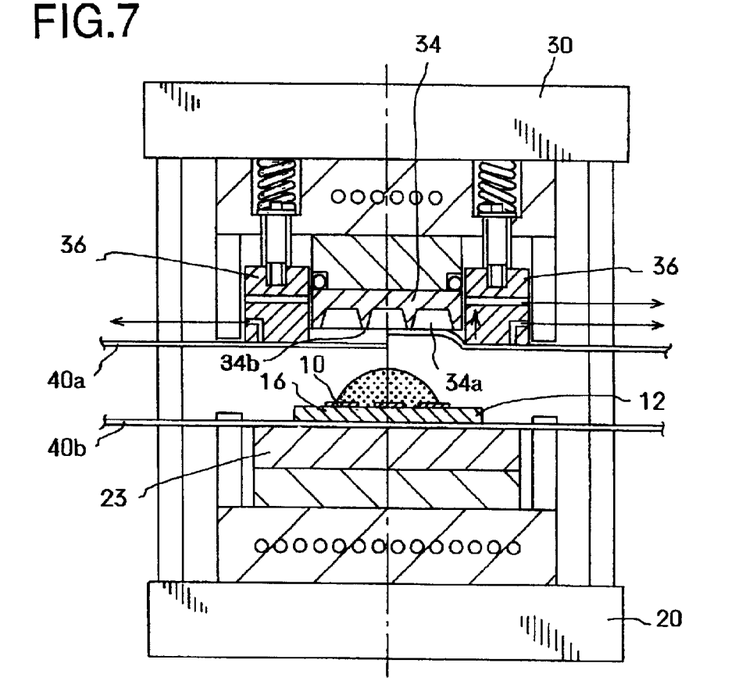
FIG. 7 is an explanation view of a resin molding machine of a fourth embodiment.
Figure 8:
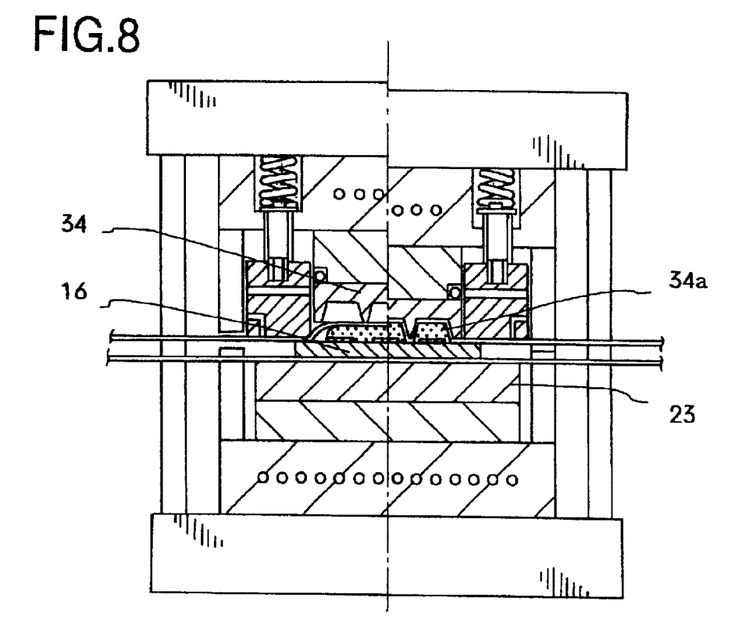
FIG. 8 is an explanation view of the resin molding machine of the fourth embodiment, in which a work piece is molded.
Figure 9:
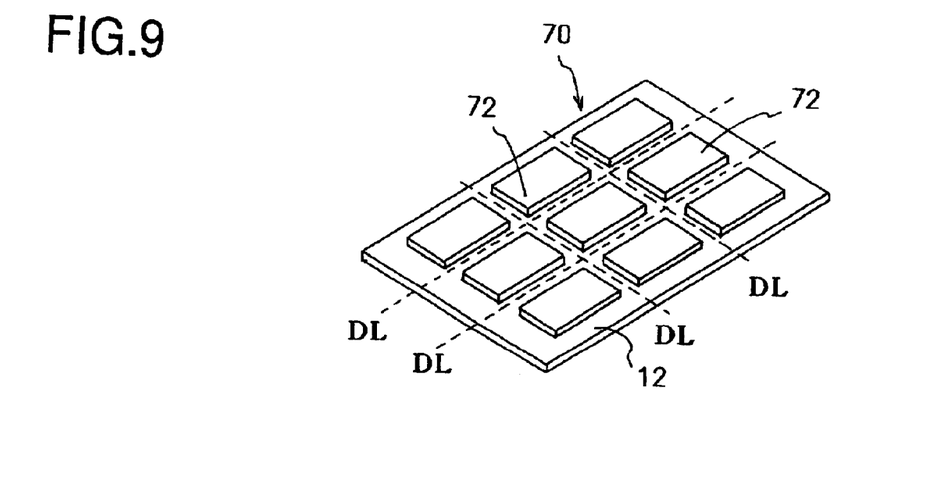
FIG. 9 is a perspective view of a product molded by the resin molding machine of the fourth embodiment.

A fourth embodiment will be explained with reference to FIGS. 7–9. In the present embodiment, semiconductor chips 10 mounted on the substrate 12 are respectively molded with resin in the upper die 34. A plurality of cavities 34a, which respectively correspond to element portions, e.g., the semiconductor chips 10, of the work piece 16, are formed in the resin molding face 34b. Namely, each semiconductor chip 10 is molded in each cavity 34a. FIG. 7 shows a state in which the work piece 16 is set in the lower die 23, and the release film 40a is fitted to the upper die 34 and the clamper 36 by air suction; FIG. 8 shows a state in which the work piece 16 is clamped together with the release film 40a and 40b and molded with resin.

The characteristic point of the fourth embodiment is the upper die 34, but other structures are equal to that of the first embodiment. A molded product 70 molded by the resin molding machine of the present embodiment is shown in FIG. 9. Molded parts 72 respectively encapsulate the semiconductor chips 10. In the resin molding machine of the present embodiment, the semiconductor chips 10 on the substrate 12 can be respectively molded with the resin. The molded product 70 will be divided along the lines DL so as to make a plurality of semiconductor devices.

Figure 10:
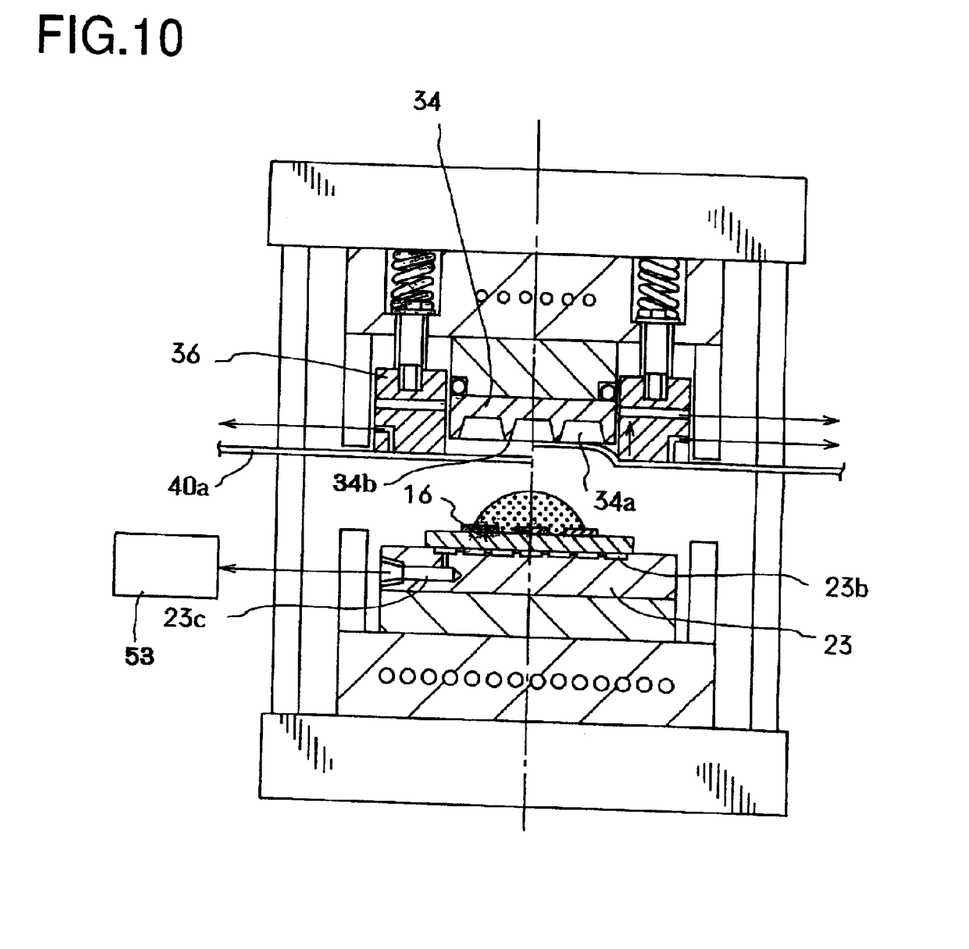
FIG. 10 is an explanation view of a resin molding machine of a fifth embodiment.

A fifth embodiment will be explained with reference to FIG. 10. In the fifth embodiment, the release film 40a is fed to only the upper die 34; no release film is fed to the lower die 23. In the present embodiment, the cavities 34a are formed in the resin molding face 34b of the upper die 34, but the upper die 34 having a flat molding face 34b may be employed.

Air sucking grooves 23b are formed in the upper face of the lower die 34 and correspond to the work piece 16. The air sucking grooves 23b are mutually communicated and further communicated to an air path 23c, which is communicated to an air sucking unit 53. With this structure, the work piece 16 can be securely set in the lower die 23 by air suction.

In the fifth embodiment too, the release film 40a covers the inner faces of the resin molding space, so no resin directly contacts the dies 23 and 34. Further, the clamper 36 and the release film 40a securely closes the edges of the substrate 12, so that the work piece 16 can be molded without forming resin flash.

In the first to fifth embodiments, the upper side of the substrate 12 is molded with the resin. The present invention can be applied to the resin molding machine, which molds the both sides of the substrate 12. This resin molding machine will be explained with reference to FIGS. 11 and 12.

Figure 11:
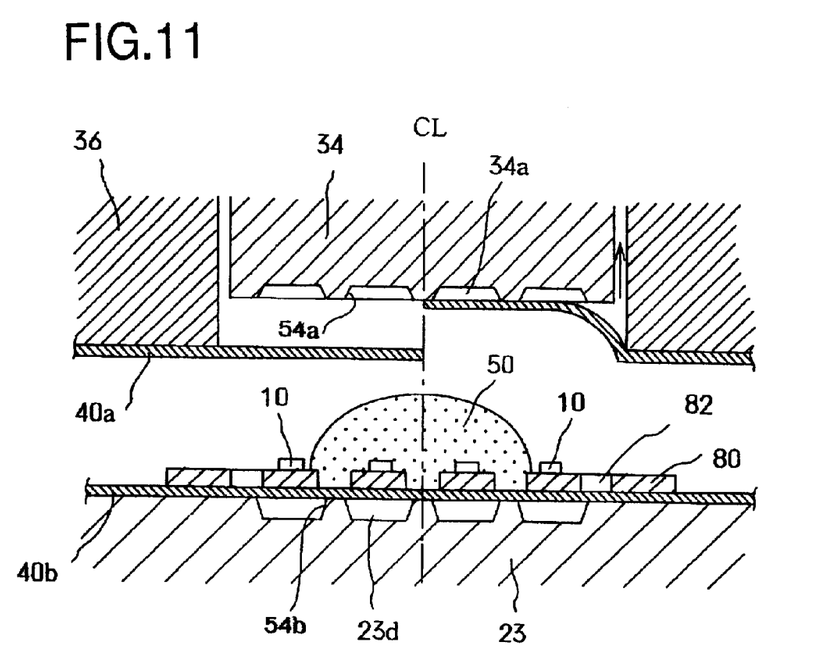
FIG. 11 is a sectional view of a main part of the resin molding machine which molds both sides of a work piece.
Figure 12:
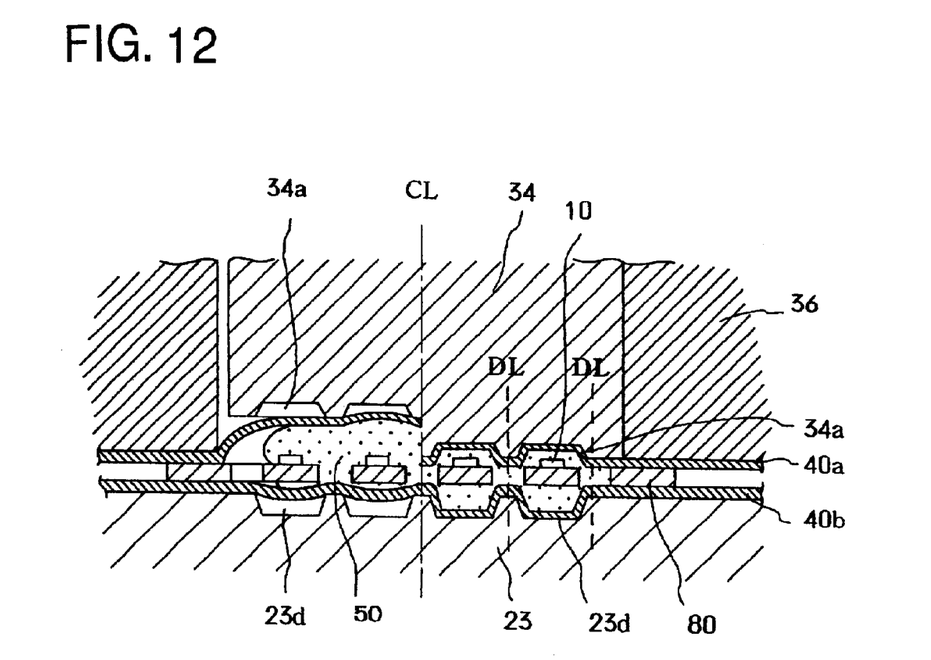
FIG. 12 is a sectional view of the resin molding machine shown in FIG. 11.

FIGS. 11 and 12 show a main part of the lower die 23 and the upper die 34. In the present embodiment too, a work piece 80 to be molded is set in the lower die 23, the resin 50 is supplied onto the work piece 80, the clamper 36 presses edges of the work piece 80, and the work piece 80 is clamped by the dies 23 and 34 and molded with the resin 50.

To mold the both sides of the work piece 80 with the resin 50, the cavities 34a, which respectively correspond to the semiconductor chips 10, are formed in the resin molding face 34b of the upper die 34, and cavities 23d, which also respectively correspond to the semiconductor chips 10, are formed in the upper face of the lower die 23. Namely, the cavities 34a of the upper die 34 and the c are mutually faced. To fill the cavities 23d of the lower die 23 with the resin 50, through-holes 82 are bored in the work piece 80. Partitions 54a and 54b are formed in the longitudinal direction and the transverse direction so as to matrically form independent cavities 34a and 23d. Therefore, the through-holes 82 are communicated to the cavities 23d.

In FIG. 11, the work piece 80 is set in the lower die 23, and the resin 50 is supplied. The upper face (resin molding face) of the lower die 23 is covered with the release film 40b, the work piece 80 and the resin 50 are supplied on the release film 40b. The release film 40a is fixed to the upper die 34 and the clamper 36 by air suction, then the upper die 34 and the clamper 36 are moved downward. In FIG. 12, a left side of a center line CL, the clamper 36 contact an upper face of the work piece 80 so as to tightly seal upper edges of the work piece 80, then the upper die 34 is further moved downward so as to exert the resin 50, so that the resin 50 is moved to the lower side of the work piece 80. The resin 50 passes through the through-holes 82 and extends the release film 40b, so that the cavities 23d are filled with the resin 50.

In FIG. 12, a right side of the center line CL shows a state in which the upper die 34 is completely moved to the lowest clamping position, the resin 50 fills not only the cavities 34a but also the through-holes 82 and the cavities 23d. Namely, the both sides of the work piece 80 are completely molded with the resin 50.

The through-holes 82 of the work piece 80 are also filled with the resin 50, but the molded product 80 will be cut along the lines DL so as to make a plurality of semiconductor devices and remove the solidified resin left in the through-holes 82.

In the resin molding machine of the above described embodiments, the work piece 16 or 80 is set in the lower die 23, so the work piece 16 or 80 can be easily set. The work piece 16 or 80 can be preheated, so they can be securely molded with resin. By clamping the work piece together with the release films 40a and 40b, no resin directly contacts the surfaces of the dies, so that the molded product can be easily ejected from the dies and the resin molding can be securely executed without forming resin flash.

In the foregoing embodiments, the upper die is the movable die and the lower die is the fixed die. In any embodiments, the upper die may be the fixed die and the lower die may be the movable die. Of course, structures of the dies are not limited to the foregoing embodiments, so many types of dies may be employed. Number of the work piece set in the lower die is not limited to one; two or more work pieces may be set and molded in the die. The element portion of the work piece is not limited to the semiconductor chip. For example, a circuit board in which semiconductor chips are connected by flip-chip connection or wire bonding may be molded as the work piece.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A resin molding machine, comprising:
    a lower die on which a work piece to be molded is set;
    an upper die clamping the work piece with said lower die;
    a release film feeding mechanism feeding release film, which is easily peelable from said upper die and resin for molding, so as to cover the resin molding space;
    a clamper being provided to said upper die, said clamper enclosing a resin molding space of said upper die, said clamper being capable of vertically moving in said upper die and always biased downward; and
    a release film sucking mechanism, which fixes the release film on a lower end face of said clamper by air suction and which fixes the release film on an inner face of the resin molding space, which is constituted by the resin molding face of said upper die and an inner face of said clamper, by sucking air from a ceiling face of the resin molding space,
    wherein a lower end of said clamper is downwardly projected from a resin molding face of said upper die when said lower die and upper die are opened,
    said clamper is capable of contacting an upper face of the work piece, which is set in said lower die, with the release film and closing the resin molding space, and
    the resin is liquid resin or paste resin.

2. The resin molding machine according to claim 1, further comprising another release film feeding mechanism feeding release film so as to cover a surface of said lower die on which the work piece is set.

3. The resin molding machine according to claim 1, wherein said release film sucking mechanism comprises:
    a first air-hole being opened in the lower end face of said clamper;
    a second air-hole being opened in an inner face of said clamper and communicated to an air path, which communicates said second air-hole to a side face of said upper die; and
    an air sucking unit being communicated to said first air-hole and second air-hole for air suction.

4. The resin molding machine according to claim 1, wherein said upper die has a plurality of cavities, which respectively correspond to element portions of the work piece.

5. The resin molding machine according to claim 4, wherein said lower die has a plurality of cavities, which respectively correspond to element portions of the work piece.

6. The resin molding machine according to claim 1, wherein said upper die is capable of moving in the vertical direction and biased toward said lower die.

7. The resin molding machine according to claim 1, wherein said lower die further has an overflow cavity for reservoiring resin overflowed from the resin molding space when the work piece is molded with the resin; and
    wherein said clamper has a resin path communicating the resin molding space to the overflow cavity.

8. A method of resin molding,
    comprising the steps of:
    setting a work piece to be molded on a lower die;
    feeding release film, which is easily peelable from the upper die and resin for molding, between an upper die and the work piece so as to cover a resin molding space of the upper die;
    clamping the work piece and the release film by the upper die and the lower die; and
    molding the work piece with the resin,
    wherein a clamper, which is provided to the upper die, which encloses the resin molding space and which is capable of vertically moving and biased downward so as to downwardly projected a lower end of the clamper from a resin molding face of the upper die, contacts the work piece molded so as to seal peripheral of the resin molding space in said clamping step, and
    wherein the resin is introduced into the resin molding space while the upper die is gradually moved to the lower die, the movement of the upper die is stopped at a clamping position, then the resin molding space is fully filled with the resin so as to completely mold the work piece.

* * * * *